United States Patent [19]

Borg

[11] 4,123,716
[45] Oct. 31, 1978

[54] AUTOMATIC FREQUENCY CONTROL FOR DIGITAL TUNING SYSTEMS

[75] Inventor: Arthur N. Borg, Fort Wayne, Ind.

[73] Assignee: The Magnavox Company, Fort Wayne, Ind.

[21] Appl. No.: 713,731

[22] Filed: Aug. 12, 1976

[51] Int. Cl.² .............................................. H04B 1/06
[52] U.S. Cl. ................................... 325/464; 325/423; 325/470
[58] Field of Search ............................. 325/419–423, 325/453–457, 458, 459, 464, 465, 468, 470; 331/1 A; 358/195, 191

[56] References Cited

U.S. PATENT DOCUMENTS

| 2,976,411 | 3/1961 | Kahn | 325/423 |
| 3,492,584 | 1/1970 | Takahashi | 325/423 |
| 3,806,826 | 4/1974 | Schlosser | 331/1 A |
| 3,845,393 | 10/1974 | Basset | 325/464 |
| 3,863,156 | 1/1975 | Bogert | 325/420 |
| 3,936,753 | 2/1976 | Clark | 325/420 |
| 3,949,158 | 4/1976 | Rzeszewski et al. | 325/423 |
| 3,988,681 | 10/1976 | Schurmann | 325/464 |
| 4,004,231 | 1/1977 | Elshuber et al. | 325/464 |

OTHER PUBLICATIONS

"An Automatic-Freq.-Control System For High-Freq. Radio Receivers" by Reynolds, Post Office Electrical Engineers' Journal, vol. 67, pt.2, pp. 115–117, Jul. 1974.

Primary Examiner—Robert L. Griffin
Assistant Examiner—Jin F. Ng
Attorney, Agent, or Firm—George R. Pettit

[57] ABSTRACT

Apparatus is provided for automatically compensating for frequency drift in a digitally tuned varactor tuner. An Automatic Frequency Control signal for tuning the varactor tuner is produced in response to the direction of a tuning error. A signal level detector is used to inhibit the AFC signal when weak signals are being tuned by the varactor tuner thereby preventing continuous searching by the tuning system.

8 Claims, 2 Drawing Figures

AUTOMATIC FREQUENCY CONTROL FOR DIGITAL TUNING SYSTEMS

BACKGROUND OF THE INVENTION

Automatic frequency control (AFC) is provided by this invention for varactor tuning systems such as the one described in copending application Ser. No. 684,339 filed May 7, 1976, now abandoned, in the name of Arthur N. Borg and Daniel A. Heuer, common assignee, hereby incorporated by reference. Specific circuitry for developing a control signal for keeping a digital varactor tuning system tuned to a given signal is provided.

Varactor tuners are well known in the art. In recent times digital techniques have been used to provide tuning voltages for tuning the varactor tuner. These systems all have in common the generation of a multibit binary word for identifying a particular tuning voltage to be applied to the varactor tuner. As with other tuning systems, it is desirable to provide a correction signal for maintaining the varactor tuner tuned to a received signal. The associated frequency drift between the tuning system and the received signal is continuously monitored with a frequency discriminator and the tuning voltage corrected to compensate for the frequency drift.

One technique is to convert the stored binary word into an analog voltage by means of a D/A converter. The analog voltage is then summed with the AFC voltage to provide the varactor control voltage. Another technique is to alter the stored binary word in response to the AFC voltage. This technique offers certain advantages, such as being better adapted to integrated circuit technology, and therefore more economically manufactured. This technique will also compensate for long term "secular" frequency drift which is inherent in some tuners. However, because the stored binary word is modified by this technique, there is a possibility that the stored word may be modified excessively. This can occur when the receiver is tuned to a weak signal or goes off the air.

If the station signal is weak, the discriminator which provides the AFC signal will be considerably unbalanced due to the frequency response of the receiver IF and the varactor tuning system will tune continuously for the desired tuning frequency in an effort to minimize an apparent tuning error. In the absence of a received signal (or the presence of a very weak station signal), the tuning error detected by the AFC circuit will not be diminished and the varactor tuning system will continue tuning up or down in frequency in an attempt to locate the proper tuning point. Therefore, in systems which attempt to maintain tuning by altering the binary word defining the tuning voltage it is desirable to provide additional means for disabling the AFC in the absence of a signal having sufficient strength. Requiring the received signal to have a minimum signal level before AFC action commences also allows the tuning of weak signals to a desired tuning frequency which is slightly different from the "proper" tuning point.

SUMMARY OF THE INVENTION

It is therefore an object of this invention to provide an AFC circuit for correcting tuning errors in a varactor tuning system.

It is a further object of this invention to provide a signal strength threshold detection means for disabling the automatic frequency control when a tuned signal is below a threshold level.

Varactor tuning systems of the type wherein a multi-digit binary word is used to develop a tuning voltage for a varactor tuner may incorporate the invention described herein to maintain tuning of a received signal. A frequency discriminator provides a voltage indicative of the frequency difference (tuning error) between a received signal and the tuner frequency. A plurality of voltage detectors are used to determine when the voltage produced by a tuning error exceeds a desired amount, $\Delta V$. When the presence of an excessive tuning error is detected, a series of clock pulses are provided to modify the multidigit binary word of the varactor tuning system so that the tuning error is minimized.

In one embodiment of this invention, an AGC voltage detection circuit imposes a further condition on the AFC circuit. In a television receiver, the sound carrier or synchronizing signal may be employed by those skilled in the art in lieu of the AGC voltage. The Automatic gain control (AGC) voltage must exceed a predetermined threshold voltage before the varactor tuner will be tuned by the AFC signal. This will prevent the tuning system from hunting when no station signal (or a very weak signal) is present. Also, this feature will allow tuning the varactor tuner without the benefit of AFC action when very weak signals are being tuned. Those skilled in the art will recognize advantages to disabling the AFC circuit when a weak signal is being tuned.

DESCRIPTION OF THE PREFERRED EMBODIMENT

Figure 1:
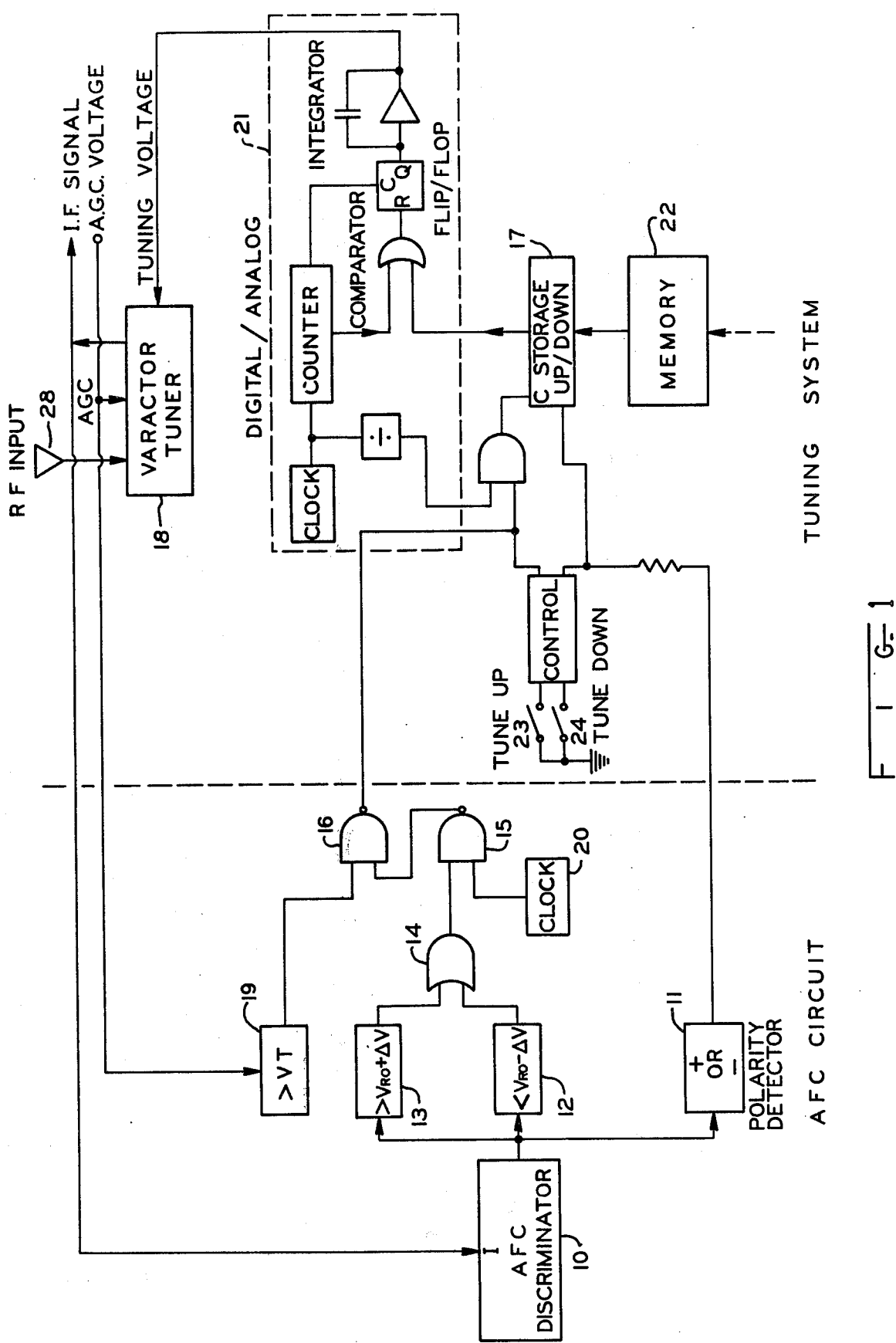
FIG. 1 shows the preferred embodiment of this invention incorporated in a known varactor tuning system.

Referring now to FIG. 1, the AFC circuit of this invention is shown implemented with the varactor tuning system described in the aforementioned copending application. A varactor tuner 18 provides filtering, amplification, and down conversion to an intermediate frequency. The tuning frequency of the varactor tuner 18 is established by the application of a particular tuning voltage to the varactor tuner 18. The varactor tuner 18 having provided gain and filtering to signals supplied by an antenna 28, mixes the tuned signals with a local oscillator signal to produce an I.F. signal for further signal processing. Additionally, the varactor tuner 18 receives an AGC (automatic gain control) voltage for adjusting the gain of the tuner 18 and succeeding amplifier circuits. The AGC voltage causes the gain imparted to received signals which are weak to increase, and causes the gain imparted to stronger signals to decrease, thus avoiding saturation of the amplifier system. The generation of AGC voltage for changing the gain is well known in the art.

The apparatus of this invention uses a frequency discriminator 10 to derive a d.c. voltage indicative of the frequency of the I.F. signal produced by the varactor tuner 18. Since the variation of I.F. signal frequency is proportional to the difference in the tuning frequency and the desired signal frequency, monitoring the I.F. signal frequency will provide an indication of the tuning error. When proper tuning is achieved, the I.F. signal frequency is nominal. Since tuning errors will produce a change in I.F. signal frequency, the voltage produced by the discriminator 10 is indicative of the magnitude and direction of a tuning error. This discriminator 10 may be any of a number of commonly available discriminators having a center frequency at the nominal I.F. signal frequency.

Figure 2:
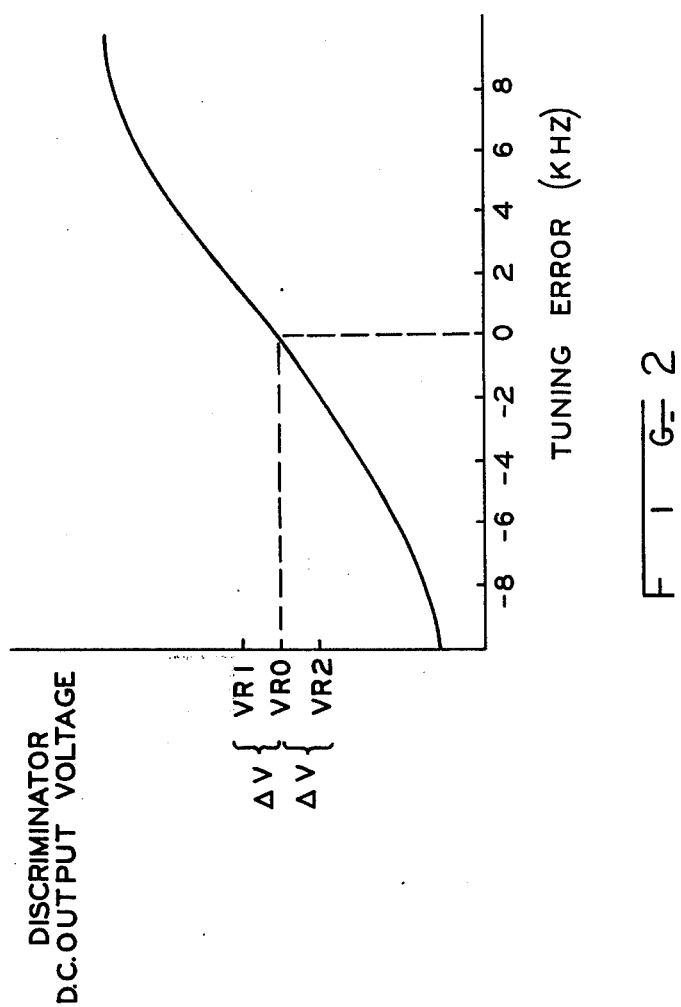
FIG. 2 illustrates the response of the AFC frequency discriminator to a tuning error.

Referring now to FIG. 2, the operation of the frequency discriminator 10 may be explained. When the frequency of the received signal and the tuning frequency are identical, the AFC frequency discriminator 10 provides a d.c. voltage VR0 indicating that there is no tuning error. If the tuning frequency becomes higher than the received frequency, a positive tuning error is indicated by the production of a voltage change $\Delta V$ from the previous VR0 level to a new level VR1. If the tuning frequency is lower than the received signal frequency, the voltage produced by the discriminator 10 is decreased by $\Delta V$ in a similar manner indicating a negative tuning error. The apparatus of this invention detects a change in discriminator 10 output voltage from VR0 to VR1 or VR2 and provides a signal for changing the tuning frequency of the varactor tuner 18 so as to reduce the tuning error indicated by the discriminator 10.

The signal for changing the varactor tuning frequency is derived by a "window" detector. This detector comprises two voltage comparators 12 and 13 well known to those skilled in the art and an OR gate 14. The voltage comparators, 12 and 13, are set up so that when a tuning error voltage produced by discriminator 10 exceeds $\Delta V$, the varactor tuner will be caused to change frequency to correct for the error. When the discriminator 10 produces an output voltage between VR0+$\Delta V$, and VR0−$\Delta V$, no command is given to the varactor tuning system and the tuner remains tuned at a fixed frequency. When the discriminator 10 produces a voltage that exceeds VR0+$\Delta V$, indicating a positive tuning error, voltage comparator 13 produces an enabling signal. Similarly, voltage comparator 12 produces a signal when the discriminator 10 produces a voltage of less than VR0−$\Delta V$. OR gate 14 couples the signal produced by comparators 12 or 13 to another gate, NAND gate 15. NAND gate 15 supplies clock pulses from a clock generator 20 for modifying the stored binary word to correct the varactor tuner control voltage. In this way, clock pulses for tuning the varactor tuner 18 are produced when a tuning error voltage exceeds $\Delta V$.

A polarity detector 11 controls the direction in which the stored binary word is modified so that the tuner 18 will tune up in frequency when the discriminator 10 output voltage exceeds VR0, and tune down in frequency when the discriminator 10 output voltage is less than VR0. The polarity detector may also be a voltage comparator, well known to those skilled in the art, having a reference voltage of VR0. Input voltages exceeding VR0 produce one output level and input voltages less then VR0 produce another output voltage level. The output voltage from the polarity detector 11 is used in a manner to be explained to either increment or decrement the binary tuning word used to establish a tuning voltage.

The tuning system shown for use with the AFC circuit has a digital counter 17 containing the binary word for establishing the correct tuning voltage for the varactor tuner 18. The contents of the digital counter 17 may be initialized by a memory 22 or by activating switches 23 or 24. By applying clock pulses to the C input of counter 17, the counter 17 may be incremented or decremented, thereby modifying the stored binary word. Therefore, tuning may be accomplished by providing clock pulses by activating the tune switches 23, 24, or by supplying clock pulses from NAND gate 16. The operation of the tuning system shown partially in FIG. 1 is described more particularly in the aforementioned copending application. The voltage level applied to the up-down input of counter 17 determines whether the counter 17 will increase or decrease the number stored in the counter 17. The counter 17 therefore will increment or decrement depending upon the output of the polarity detector 11. The parallel output of counter 17 is converted to a d.c. voltage by a digital-to-analog (D/A) converter 21. The details of this particular D/A converter are also disclosed in the referenced copending application.

A further condition is imposed upon the AFC circuit. The AGC voltage or similar signal level indicating voltage is detected with another voltage comparator circuit 19. Those skilled in the television art will recognize that the sound carrier or synchronization signals in a video signal may be used to detect the received signal level. This voltage comparator circuit 19 determines when the AGC voltage, indicating the strength of a tuned signal, exceeds a certain threshold level. Clock pulses to counter 17 are inhibited by the action of the comparator 19 and NAND gate 16 unless the AGC voltage exceeds a certain minimum threshold level, VT, indicating the presence of a received signal having a minimum amplitude. In this way, loss of a signal from either turning off the receiver or by removing the antenna from the receiver will not cause the turning point to change. Without the added condition of signal level threshold detection, the varactor tuning system would tune up or tune down in an effort to correct for a voltage unbalance produced by the discriminator. NAND gate 16 combines the output of AGC voltage threshold detector 19 with the output of NAND gate 15. When a suitable signal level is detected by voltage comparator 19, and a tuning error command is produced by NAND gate 15, the varactor tuning system will operate to reduce the error. NAND gate 16 will supply the necessary clock pulses for causing counter 17 containing the tuning word in the varactor tuning system to modify the tuning word and reduce the tuning error.

Polarity detector 11 will control the counting direction (either up or down) of counter 17 depending upon whether the received signal is higher or lower than the tuned frequency. As the tuning error is reduced, the output voltage from the discriminator 10 will approach VR0, and the varactor tuning system will discontinue tuning and remain at a fixed frequency.

The invention has been described with reference to one varactor tuning system, namely, the tuning system in the referenced copending application. Other tuning systems which use a multidigit binary word for developing a tuning voltage may be modified by those skilled in the art for use with the AFC circuit of this invention.

What is claimed is:

1. In combination, a varactor tuner for providing an intermediate frequency signal in response to a radio frequency signal, a tuning system of the type wherein a binary word is used to develop a tuning voltage for selecting the tuning frequency of said varactor tuner, an automatic frequency control apparatus comprising a frequency discriminator for providing a signal indicative of the direction of a tuning error in response to said intermediate frequency signal, and means for modifying said binary word in response to said discriminator signal to minimize said tuning error.

2. The apparatus of claim 1 further comprising means for inhibiting the modifying of said binary word when a received radio frequency signal is below a minimum threshold level.

3. An automatic frequency control circuit for a receiver having a varactor tuner for producing an intermediate frequency signal and a tuning system of the type wherein a digital counter produces a binary word, said binary word being thereafter converted into a tuning voltage for selecting the tuning frequency of said varactor tuner comprising:
   (a) a frequency discriminator operatively connected to said varactor tuner for producing a signal for indicating a tuning error in response to said intermediate frequency signal;
   (b) detector means operatively connected to said frequency discriminator for determining the direction of said tuning error; and
   (c) means for modifying said counter contents in response to said detector means whereby said tuning error is reduced.

4. The apparatus of claim 3 further comprising threshold detection means for determining when a received signal exceeds a threshold level and means for inhibiting said means for modifying said counter contents in response to said threshold detection means.

5. An automatic frequency control circuit for maintaining tuning of a digital tuning system of the type wherein the contents of a binary counter establish a tuning voltage, comprising:
   (a) discriminator means for indicating a tuning error;
   (b) means for producing a first voltage when a positive tuning error in excess of a predetermined minimum exists;
   (c) means for producing a second voltage when a negative tuning error in excess of a predetermined minimum exists;
   (d) an OR gate for receiving said first voltage and said second voltage;
   (e) means for supplying clock pulses to said binary counter in response to said OR gate output voltage; and
   (f) a polarity detector for receiving said discriminator means output, said polarity detector operatively connected to said binary counter whereby said binary counter will increment or decrement reducing said tuning error.

6. The apparatus of claim 5 further comprising means for inhibiting said clock pulses when a received signal level is below a predetermined threshold level.

7. In combination, a varactor tuner for providing an intermediate frequency signal in response to a radio frequency signal, a tuning system of the type wherein a binary word is used to develop a tuning voltage for selecting the tuning frequency of a varactor tuner, an automatic frequency control apparatus comprising a frequency discriminator for providing a tuning signal indicative of the magnitude and direction of a tuning error in response to said intermediate frequency signal, means for detecting when said tuning error exceeds a threshold level, and means for modifying said binary word to minimize said tuning error when said tuning error exceeds said threshold level.

8. The apparatus of claim 7 further comprising means for inhibiting the modifying of said binary word when a received radio frequency signal is below a minimum threshold level.

* * * * *